United States Patent
Lin et al.

(10) Patent No.: US 9,373,610 B2
(45) Date of Patent: *Jun. 21, 2016

(54) PROCESS FOR FORMING PACKAGE-ON-PACKAGE STRUCTURES

(71) Applicant: Taiwan Semiconductor Manufacturing Company, Ltd., Hsin-Chu (TW)

(72) Inventors: Chih-Wei Lin, Zhubei (TW); Ming-Da Cheng, Jhubei (TW); Meng-Tse Chen, Changzhi Township (TW); Wen-Hsiung Lu, Jhonghe (TW); Kuei-Wei Huang, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/825,722

(22) Filed: Aug. 13, 2015

(65) Prior Publication Data

US 2015/0348957 A1    Dec. 3, 2015

Related U.S. Application Data

(63) Continuation of application No. 14/638,839, filed on Mar. 4, 2015, now Pat. No. 9,117,816, which is a continuation of application No. 13/275,065, filed on Oct. 17, 2011, now Pat. No. 8,975,741.

(51) Int. Cl.
*H01L 21/00* (2006.01)
*H01L 25/00* (2006.01)
(Continued)

(52) U.S. Cl.
CPC .......... *H01L 25/50* (2013.01); *H01L 21/31051* (2013.01); *H01L 21/31127* (2013.01); *H01L 21/565* (2013.01); *H01L 21/568* (2013.01); *H01L 21/786* (2013.01); *H01L 23/5226* (2013.01); *H01L 23/5389* (2013.01); *H01L 24/03* (2013.01); *H01L 24/24* (2013.01); *H01L 24/81* (2013.01); *H01L 24/83* (2013.01); *H01L 25/0657* (2013.01); *H01L 25/105* (2013.01); *H01L 23/3128* (2013.01); *H01L 23/49816* (2013.01); *H01L 24/13* (2013.01); *H01L 24/16* (2013.01); *H01L 24/32* (2013.01); *H01L 24/73* (2013.01); *H01L 24/82* (2013.01);
(Continued)

(58) Field of Classification Search
CPC ........... H01L 2224/12105; H01L 2225/06513; H01L 23/5226
USPC .................... 438/106, 129, 108, 127
See application file for complete search history.

(56) References Cited

U.S. PATENT DOCUMENTS 5,241,456 A    8/1993 Marcinkiewicz et al.
6,960,827 B2   11/2005 Nishimura et al.
(Continued)

*Primary Examiner* — Sheila V. Clark
(74) *Attorney, Agent, or Firm* — Slater Matsil, LLP

(57) ABSTRACT

A device includes an inter-layer dielectric, a device die under the inter-layer dielectric; and a die-attach film under the inter-layer dielectric and over the device die, wherein the die-attach film is attached to the device die. A plurality of redistribution lines includes portions level with the die-attach film. A plurality of Z-interconnects is electronically coupled to the device die and the plurality of redistribution lines. A polymer-comprising material is under the inter-layer dielectric. The device die, the die-attach film, and the plurality of Z-interconnects are disposed in the polymer-comprising material.

20 Claims, 27 Drawing Sheets

(51) Int. Cl.
*H01L 21/56* (2006.01)
*H01L 25/065* (2006.01)
*H01L 21/786* (2006.01)
*H01L 21/311* (2006.01)
*H01L 23/00* (2006.01)
*H01L 21/3105* (2006.01)
*H01L 25/10* (2006.01)
*H01L 23/538* (2006.01)
*H01L 23/522* (2006.01)
*H01L 23/31* (2006.01)
*H01L 23/498* (2006.01)

(52) U.S. Cl.
CPC ...... *H01L 24/92* (2013.01); *H01L 2224/03618* (2013.01); *H01L 2224/0401* (2013.01); *H01L 2224/04105* (2013.01); *H01L 2224/12105* (2013.01); *H01L 2224/13144* (2013.01); *H01L 2224/13147* (2013.01); *H01L 2224/13164* (2013.01); *H01L 2224/16225* (2013.01); *H01L 2224/27019* (2013.01); *H01L 2224/32145* (2013.01); *H01L 2224/32225* (2013.01); *H01L 2224/73204* (2013.01); *H01L 2224/73267* (2013.01); *H01L 2224/82005* (2013.01); *H01L 2224/92125* (2013.01); *H01L 2224/92244* (2013.01); *H01L 2225/06513* (2013.01); *H01L 2225/1035* (2013.01); *H01L 2225/1041* (2013.01); *H01L 2225/1047* (2013.01); *H01L 2225/1058* (2013.01); *H01L 2924/01029* (2013.01); *H01L 2924/12042* (2013.01); *H01L 2924/15311* (2013.01); *H01L 2924/15321* (2013.01); *H01L 2924/15331* (2013.01); *H01L 2924/181* (2013.01)

(56) References Cited

U.S. PATENT DOCUMENTS

| | | | |
|---|---|---|---|
| 7,226,808 | B2 | 6/2007 | Aoyagi |
| 7,230,329 | B2 | 6/2007 | Sawamoto et al. |
| 7,321,164 | B2 | 1/2008 | Hsu |
| 7,498,666 | B2 | 3/2009 | Hussa |
| 7,573,136 | B2 | 8/2009 | Jiang et al. |
| 7,781,877 | B2 | 8/2010 | Jiang et al. |
| 8,174,109 | B2 | 5/2012 | Uchiyama |
| 8,519,544 | B2 | 8/2013 | Kim et al. |
| 9,117,816 | B2 * | 8/2015 | Lin .............. H01L 21/568 |
| 2008/0136004 | A1 | 6/2008 | Yang et al. |
| 2009/0039491 | A1 | 2/2009 | Kim et al. |
| 2009/0261466 | A1 | 10/2009 | Pagaila et al. |
| 2010/0314738 | A1 | 12/2010 | Chi et al. |
| 2011/0068464 | A1 | 3/2011 | Chi et al. |
| 2012/0199972 | A1 | 8/2012 | Pagaila et al. |
| 2012/0223426 | A9 | 9/2012 | Shim et al. |
| 2012/0286404 | A1 | 11/2012 | Pagaila |
| 2013/0049208 | A1 | 2/2013 | Cho et al. |
| 2013/0093097 | A1 | 4/2013 | Yu et al. |
| 2014/0264905 | A1 | 9/2014 | Lee et al. |

* cited by examiner

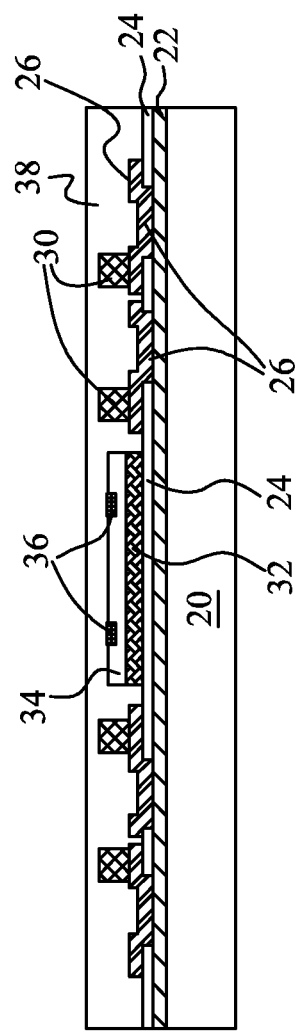
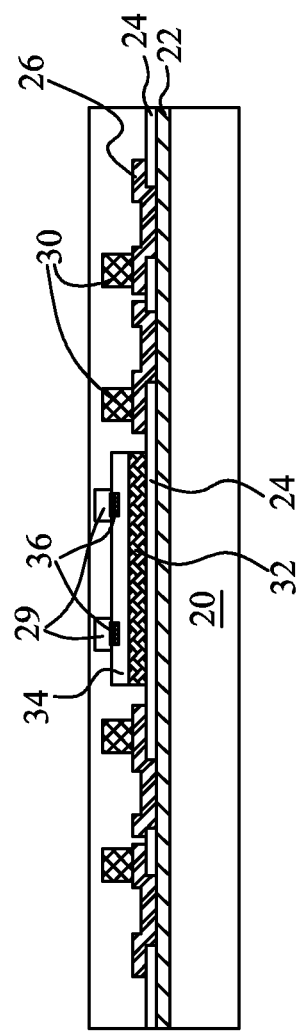
Fig. 4A
Fig. 4B

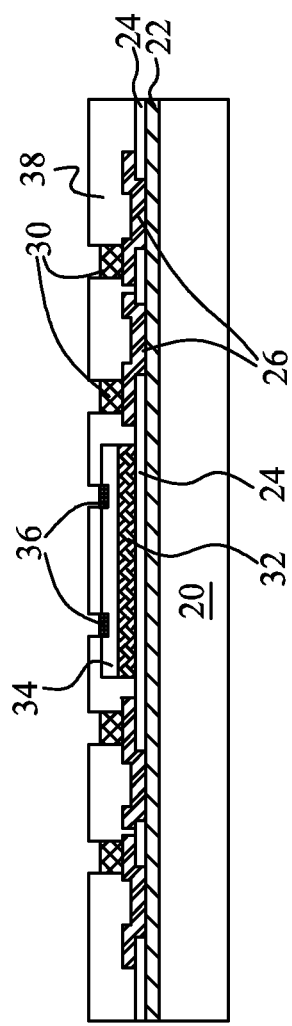
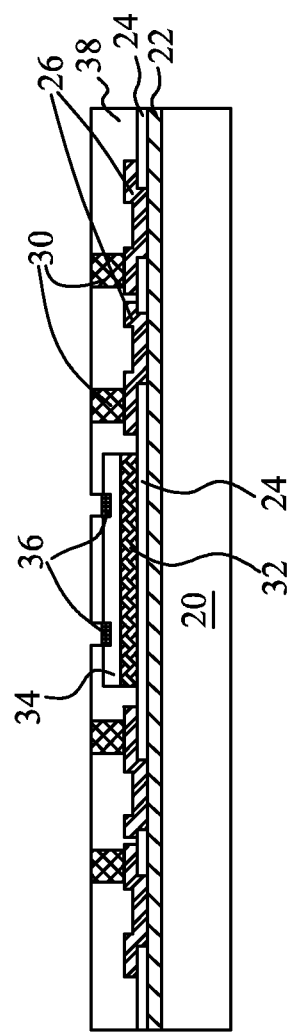
Fig. 5A
Fig. 5B

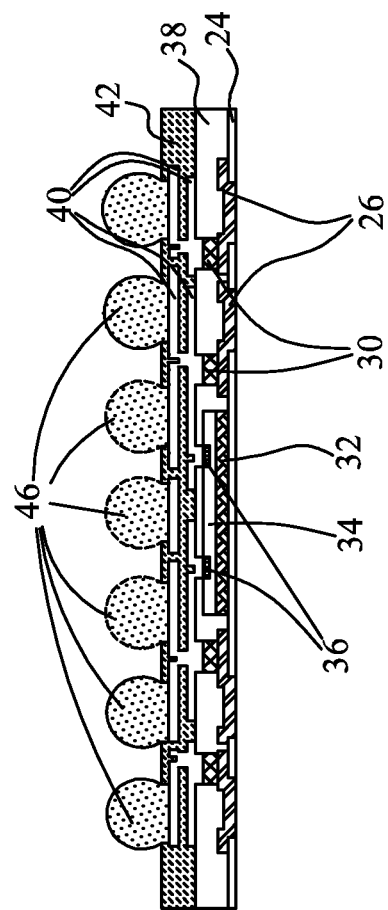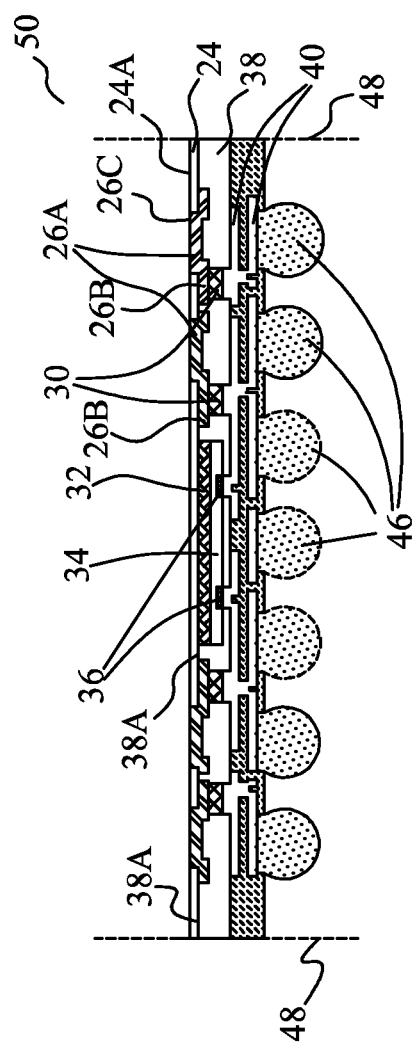

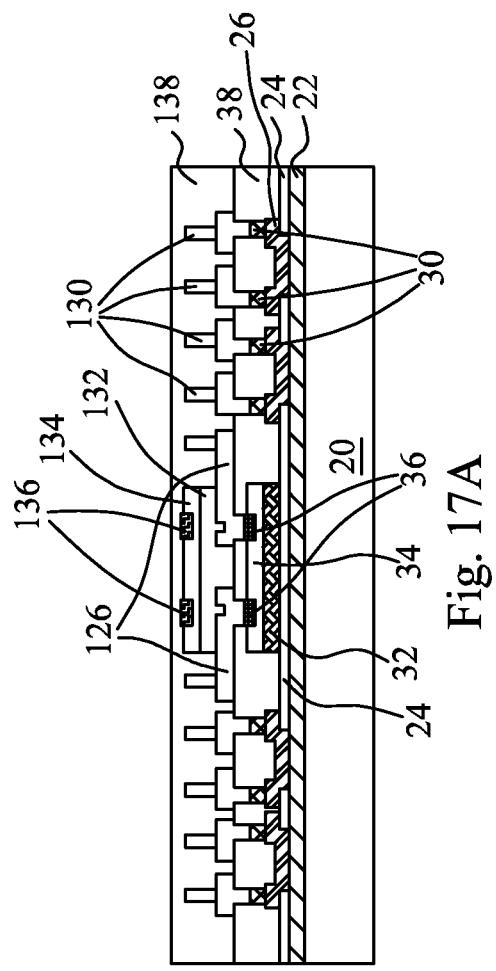
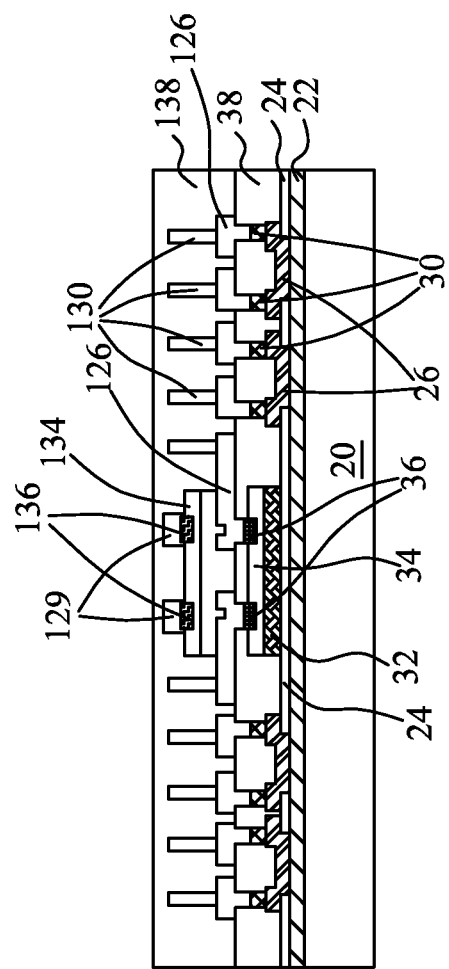
Fig. 17A
Fig. 17B

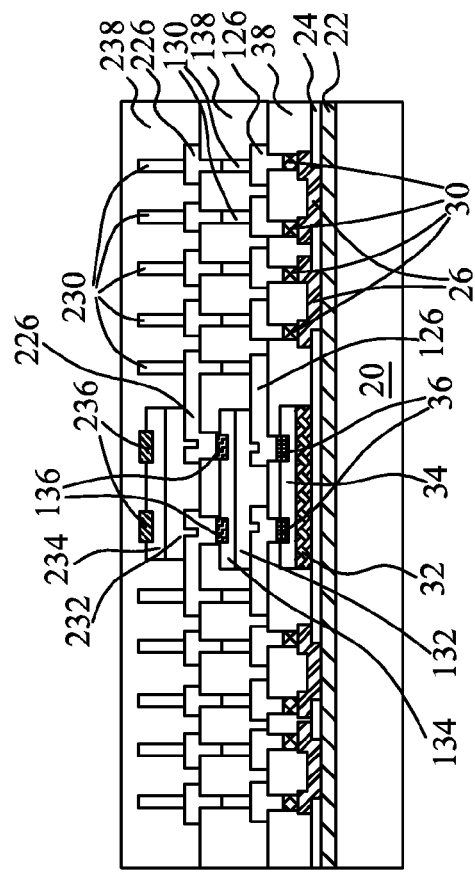
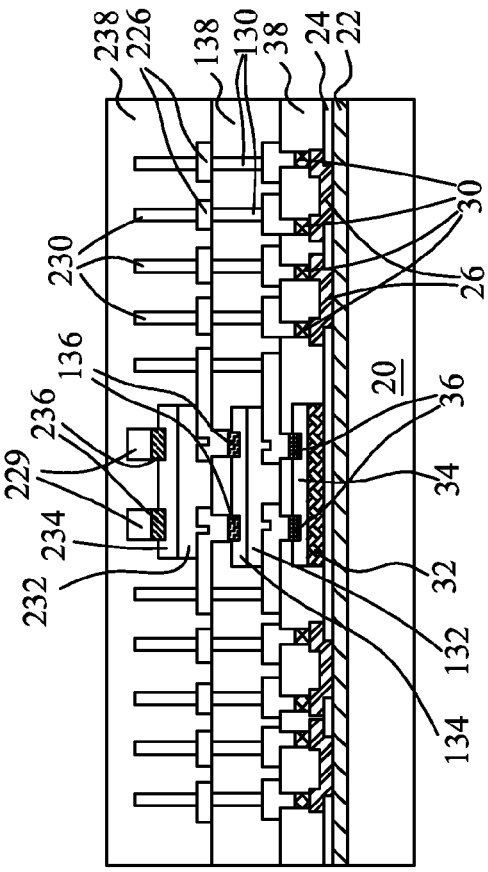
Fig. 21A
Fig. 21B

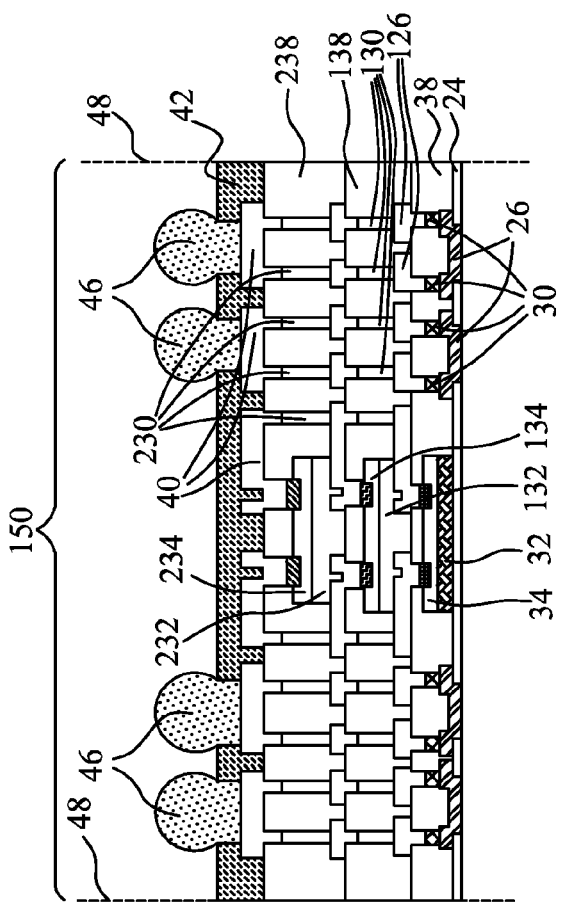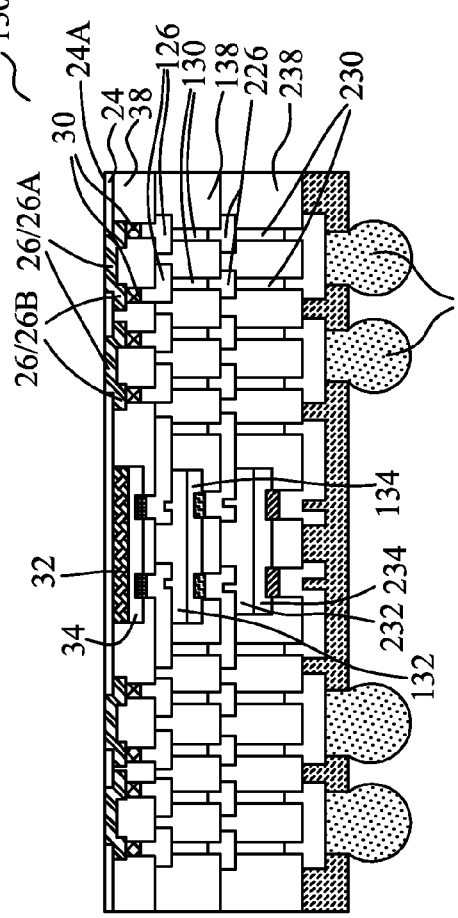

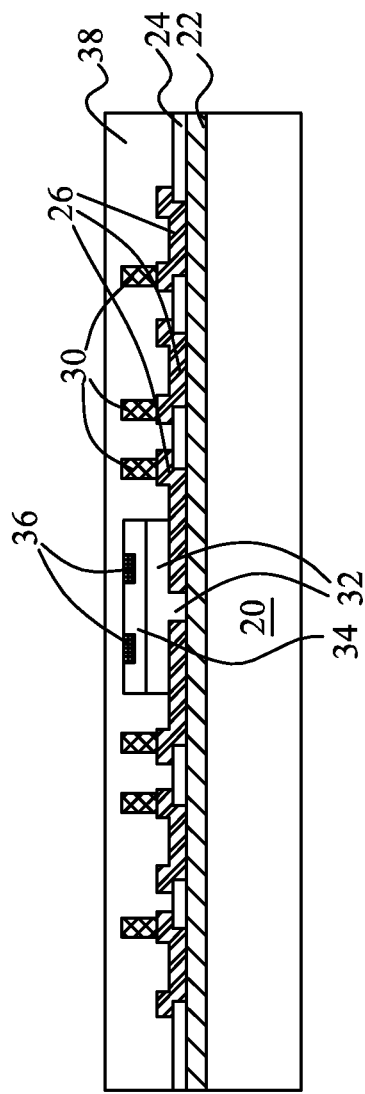
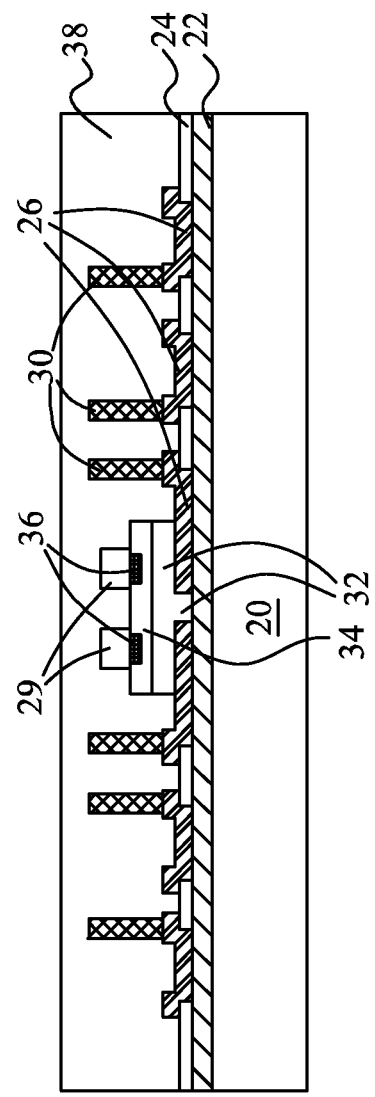
Fig. 30A
Fig. 30B

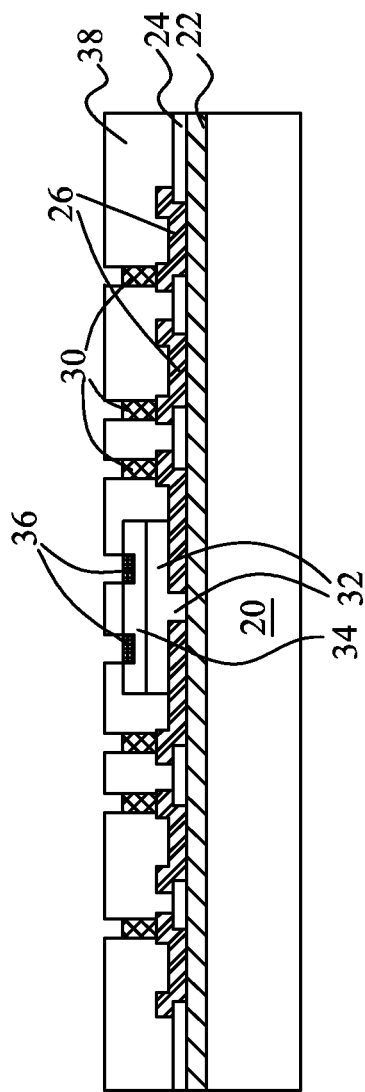
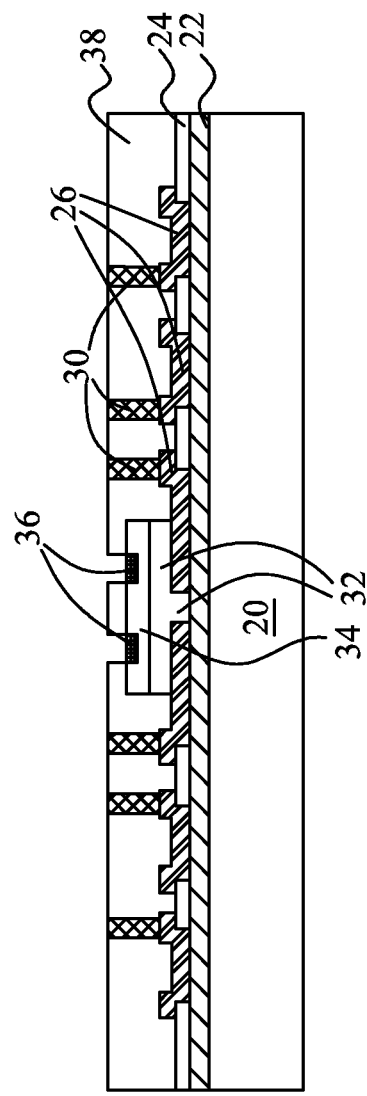
Fig. 31A
Fig. 31B

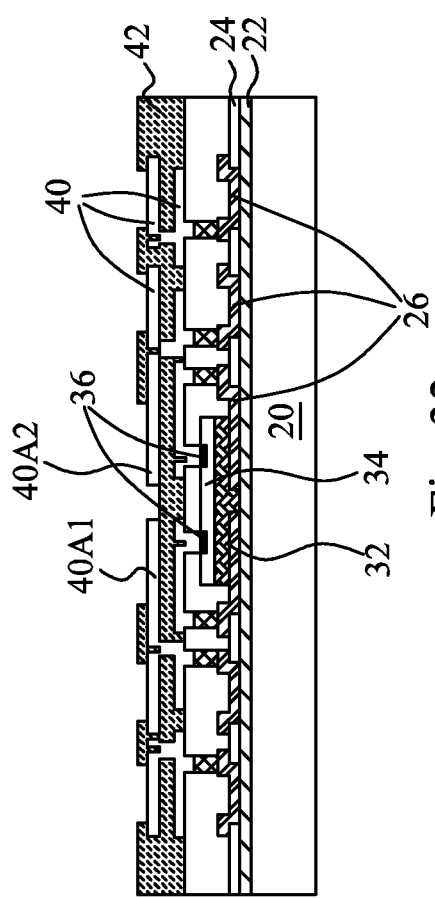
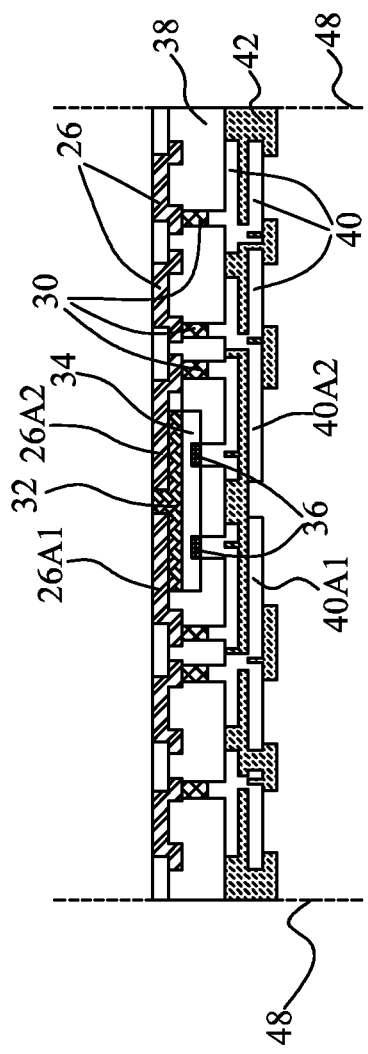

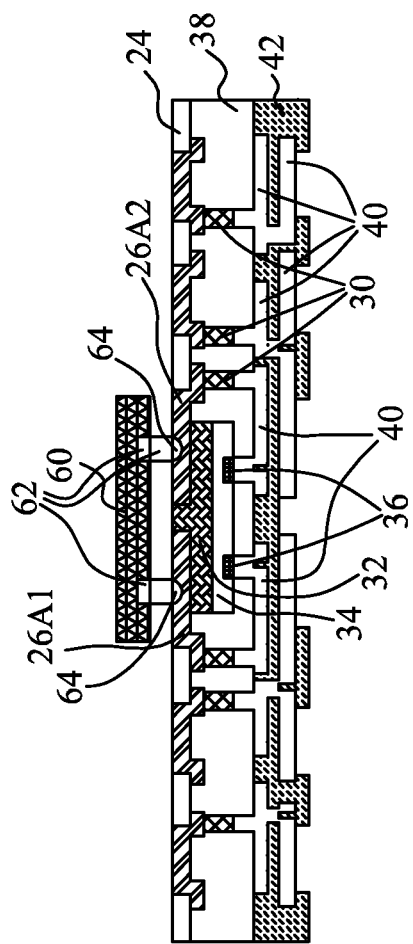
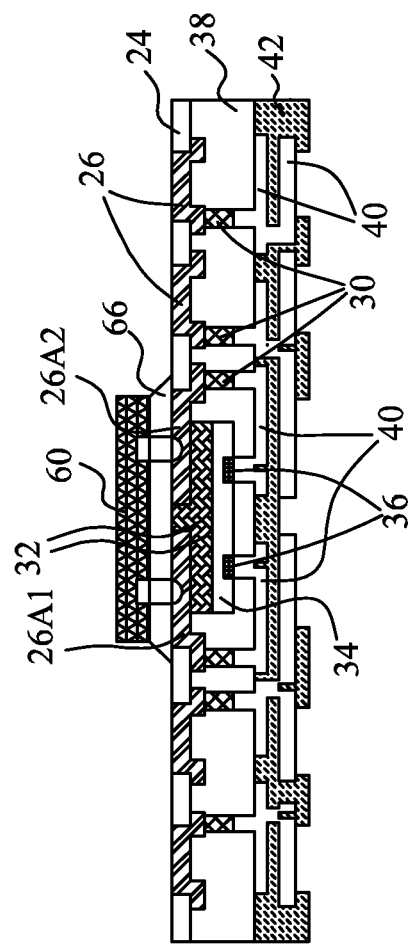
Fig. 34
Fig. 35

US 9,373,610 B2

PROCESS FOR FORMING PACKAGE-ON-PACKAGE STRUCTURES

PRIORITY CLAIM AND CROSS-REFERENCE

This application is a continuation of U.S. patent application Ser. No. 14/638,839, entitled "Process for Forming Package-on-Package Structures," filed on Mar. 4, 2015, which application is a continuation of U.S. patent application Ser. No. 13/275,065, entitled "Process for Forming Package-on-Package Structures," filed on Oct. 17, 2011, which application is incorporated herein by reference.

BACKGROUND

The fabrication of modern circuits typically involves several steps. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips, and to connect interior integrated circuits to exterior pins.

With the increasing demand for more functions, package-on-package (PoP) technology, in which two or more packages are bonded for expanding the integration ability of the packages. With a high degree of integration, the electrical performance of the resulting PoP package is improved due to the shortened connecting paths between components. By using the PoP technology, package design becomes more flexible and less complex. Time-to-market is also reduced.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 38 are re cross-sectional views of intermediate stages in the manufacturing of packages in accordance with various embodiments, wherein each of the packages include one or a plurality of device dies.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Packages and the methods of forming the same are provided in accordance with various embodiments. The intermediate stages of forming the packages are illustrated. The variations of the embodiments are discussed. Throughout the various views and illustrative embodiments, like reference numbers are used to designate like elements.

Figure 1:
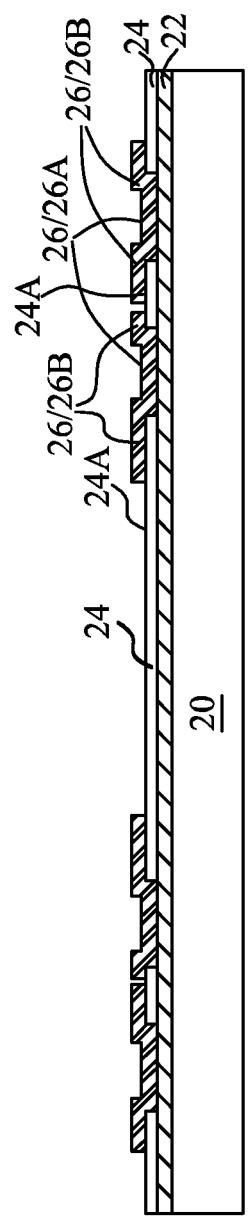

FIGS. 1 through 9 illustrate the cross-sectional views of intermediate stages in the manufacturing of a package in accordance with embodiments. FIG. 1 illustrates carrier 20 and release layer 22 formed on carrier 20. Carrier 20 may be a glass carrier, a ceramic carrier, or the like. Release layer 22 may be formed of a polymer-based material, which may be removed along with carrier 20 from the overlying structures, which will be formed in subsequent steps. In an embodiment, release layer 22 is formed of an epoxy-based thermal-release material. In other embodiments, release layer may be formed of an ultra-violet (UV) glue. In some embodiments, release layer 22 is dispensed as a liquid and cured. In alternative embodiments, release layer 22 is a laminate film, and is laminated onto carrier 20. The top surface of release layer 22 is leveled and has a high degree of co-planarity.

Dielectric layer 24 is formed on release layer 22, and redistribution lines (RDLs) 26 are formed. Dielectric layer 24 is alternatively referred to as inter-layer dielectric (ILD) 24 hereinafter. The bottom surface of ILD 24 may be in contact with the top surface of release layer 22. In an embodiment, ILD 24 is formed of a photo-sensitive material such as polybenzoxazole (PBO), polyimide, benzocyclobutene (BCB), or the like, which may be easily patterned using a lithography mask. In alternative embodiments, ILD 24 may be formed of a nitride such as silicon nitride, an oxide such as silicon oxide, phosphosilicate glass (PSG), borosilicate glass (BSG), boron-doped phosphosilicate glass (BPSG), or the like. RDLs 26 may include lower portions 26A whose bottoms contact release layer 22, and upper portions 26B whose bottom surfaces contact top surface 24A of ILD 24. The lower portions 26A have at least lower portion, and possibly all, in ILD 24, and may include narrow portions and wider portions, wherein the wide portions may act as bond pads in subsequent bonding processes. In accordance with some exemplary embodiments, the formation of RDLs 26 and ILD 24 may include forming ILD 24, etching and removing portions of ILD 24, forming an under-bump-metallurgy (UBM, not shown) over ILD 24 and release layer 22, forming and patterning a photo resist (not shown) to cover portions of the UBM, and plating a metallic material to form RDLs 26. The photo resist and the exposed portions of the UBM are then removed. RDLs 26 may be formed of copper, aluminum, tungsten, or the like.

Figure 2:
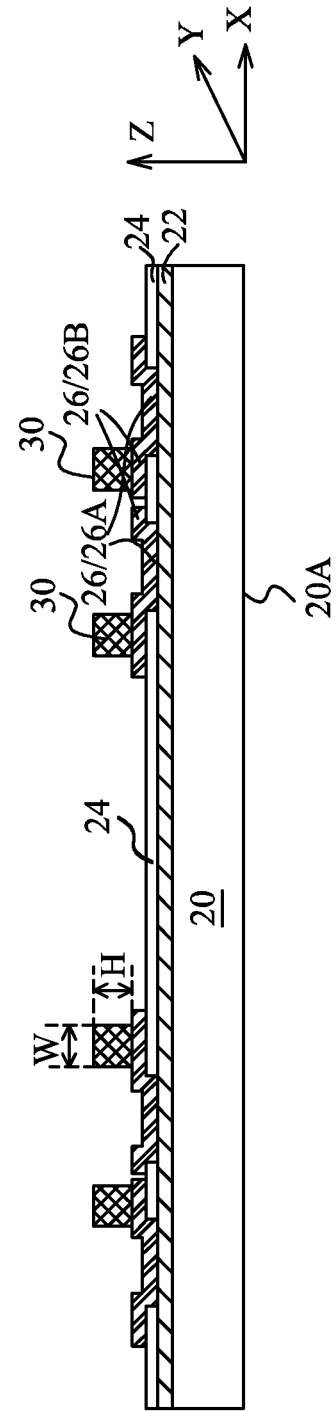

FIG. 2 illustrates the formation of Z-interconnects 30, which may have height H (in the Z-direction) that is greater than the horizontal dimensions (W). Horizontal dimensions W may be measured in the X or Y directions, which are parallel to major surface 20A of carrier 20. Z-interconnects 30 are electrically coupled to, and may be in physical contact with, RDLs 26. The longitudinal direction of Z-interconnects 30 is in the Z direction, which is perpendicular to major surface 20A of carrier 20. In an embodiment, height H of Z-interconnects 30 is greater than about 50 µm, or greater than about 100 µm. The formation process of Z-interconnects 30 may include forming a photo-sensitive material (not shown) over RDLs 26 and ILD 24, performing a lithography process to form openings (not shown) in the photo-sensitive material, and plating a metallic material into the openings. After removing the photo-sensitive material, the remaining plated metallic material forms Z-interconnects 30.

Figure 3:
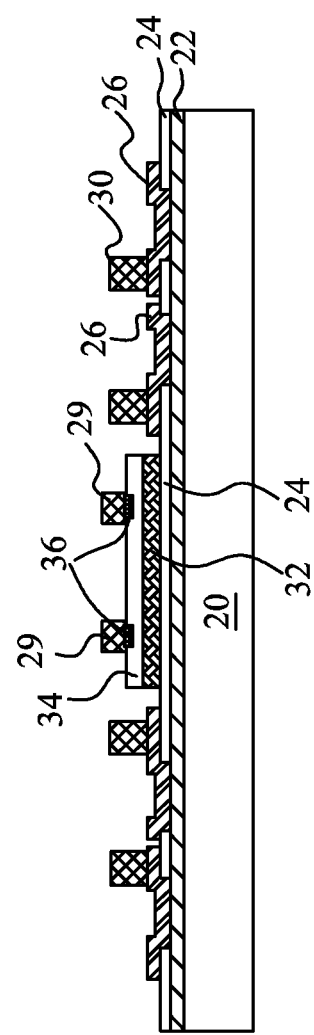

Referring to FIG. 3, die 34 is attached onto ILD 24, for example, through die-attach film 32. Die 34 may be a device die comprising active devices such as transistors (not shown) therein. Die-attach film 32 may be an adhesive film formed of an epoxy, silicon rubber, or the like. Although one die 34 is illustrated, a plurality of dies 34, which may be identical to each other or different from each other, may be attached onto ILD 24 through die-attach films. In an embodiment, die-attach film 32 is dispensed in a liquid form. In alternative embodiments, die-attach film 32 is pre-attached onto the back surface of die 34, and is then attached onto ILD 24. Die 34 includes electrical connectors 36 at the top surface, wherein electrical connectors 36 may comprise solder balls, copper pillars, contact pads, and/or the like. Optionally, a plurality of photo resist patterns 29 are formed, with each of photo resist patterns 29 covering one of electrical connectors 36.

FIGS. 4A through 5B illustrate embodiments for embedding Z-interconnects 30, die-attach film 32, and die 34 in polymer-comprising material 38. In FIG. 4A, polymer-comprising material 38 comprises a photo-sensitive material such as PBO, polyimide, BCB, or the like. Polymer-comprising material 38 may be applied in a liquid form, which is dispensed and then cured. Alternatively, polymer-comprising material 38 may be a laminated film, and is laminated onto the structure shown in FIG. 3. The top surface of polymer-comprising material 38 is higher than the top surfaces of Z-interconnects 30. Next, as shown in FIG. 5A, the photo-sensitive polymer-comprising material 38 is patterned through a lithography process, so that electrical connectors 36 and Z-interconnects 30 are exposed through the openings in polymer-comprising material 38.

FIGS. 4B and 5B illustrate alternative embodiments, wherein polymer-comprising material 38 is not formed of a photo-sensitive material. Instead, polymer-comprising material 38 is formed of a non-photo-sensitive material such as a molding compound. Accordingly, referring to FIG. 4B, polymer-comprising material 38 may be formed on the structure shown in FIG. 3 through compression molding, for example. In these embodiments, photo resist patterns 29 may be pre-formed (as shown in FIG. 3) over and overlapping electrical connectors 36 before the molding of polymer-comprising material 38. Next, as shown in FIG. 5B, a grinding is performed, until photo resist patterns 29 and Z-interconnects 30 are exposed. Photo resist patterns 29 are then removed, so that electrical connectors 36 are exposed.

In the structure shown in FIG. 5A or 5B, polymer-comprising material 38 acts as the substrate of the resulting package 50 (please refer to FIG. 9), while Z-interconnects 30 acts as the through-substrate vias (TSVs, or through-vias) in the substrate. In the embodiments as shown in FIGS. 3 through 5B, it is appreciated that the formation of Z-interconnects 30 is performed using lithography processes, and the conventional methods for forming through-vias such as laser drilling is not used. Accordingly, the pitch of Z-interconnects 30 may be small.

Figure 6:
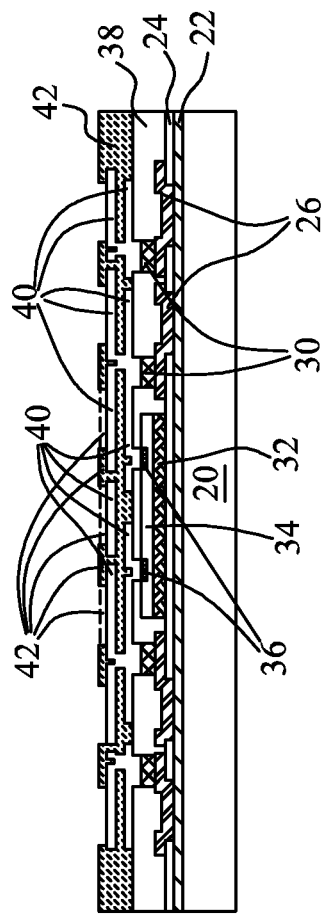

In FIG. 6, an additional layer(s) of RDLs and ILDs are formed over polymer-comprising material 38 and Z-interconnects 30. The additional RDLs are electrically coupled to Z-interconnects 30. For example, in the illustrated embodiments, RDLs 40 are formed in ILD 42, and are electrically coupled to Z-interconnects 30. The bottom layer of RDLs 40 may be in physical contact with Z-interconnects 30. The material and the formation method of RDLs 40 may be essentially the same as that of RDLs 26, although different materials and formation methods may be used. Also, the material and the formation method of ILD 42 may be selected from the same available materials and formation methods of ILD 24, although different materials and formation methods may be used. The top layer of ILD 42 may have openings, through which top surfaces of RDLs 40 are exposed. The exposed portions of RDLs 40 may act as bond pads, and hence may be referred to as bond pads 40 hereinafter. The bond pads 40 may further include an additional protective layer(s) (not shown) such as a nickel layer, a palladium layer, a gold layer, or the like. In some embodiments, bond pads 40 are not formed in the region overlapping die 34, as shown by dashed lines that represent additional ILD portions. In alternative embodiments, bond pads 40 may be formed vertically overlapping die 34, and the illustrated dashed regions do not have ILD 42 formed therein.

Figure 7:
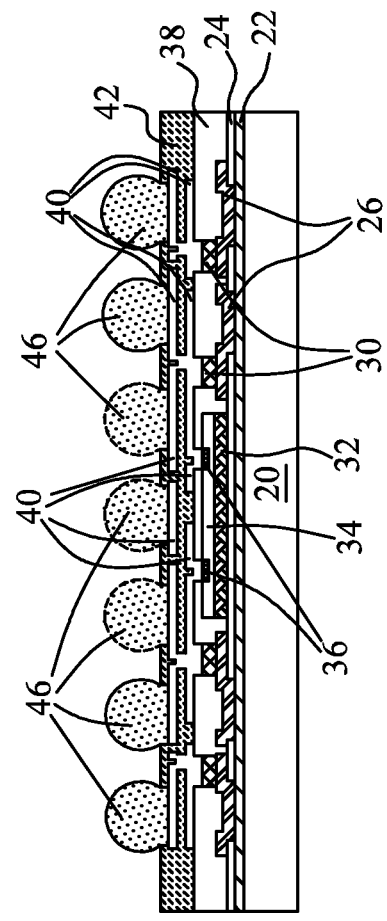
Figure 10:
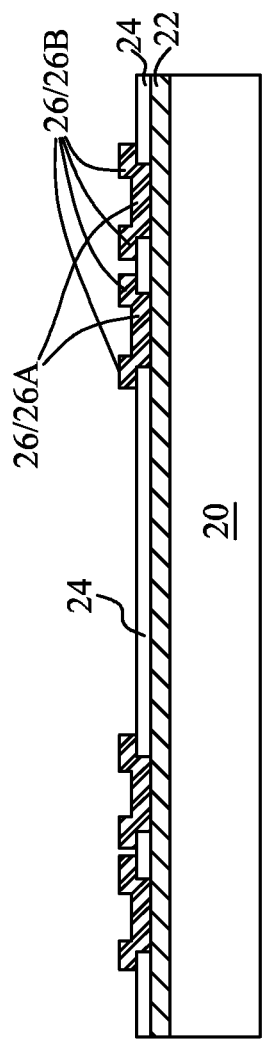
Figure 11:
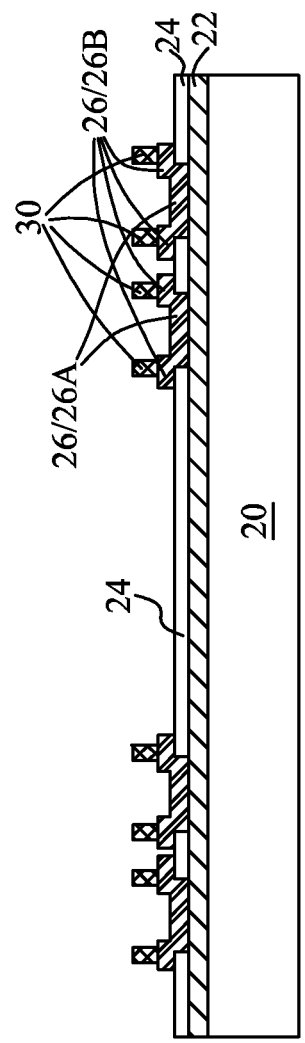
Figure 12:
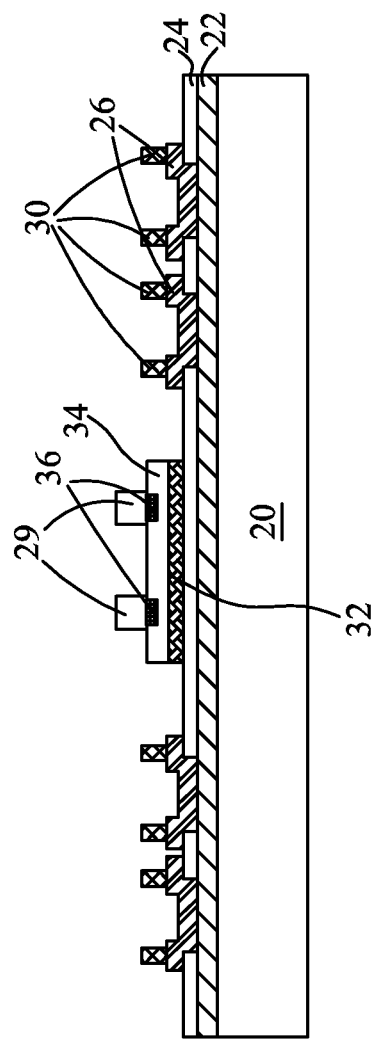
Figure 13A:
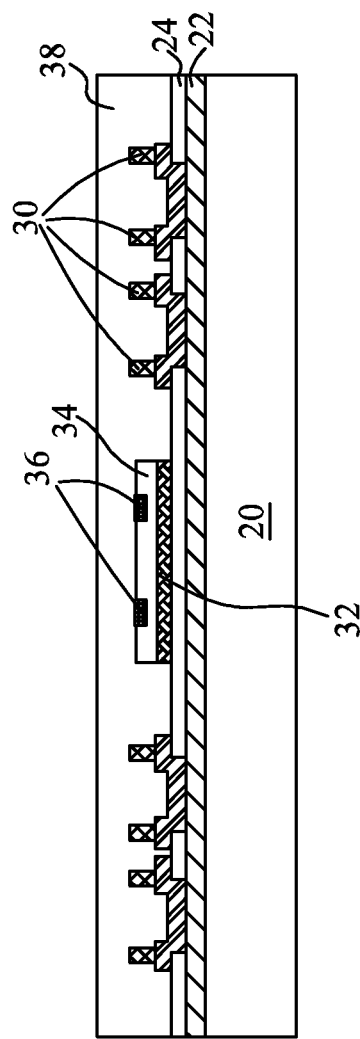
Figure 13B:
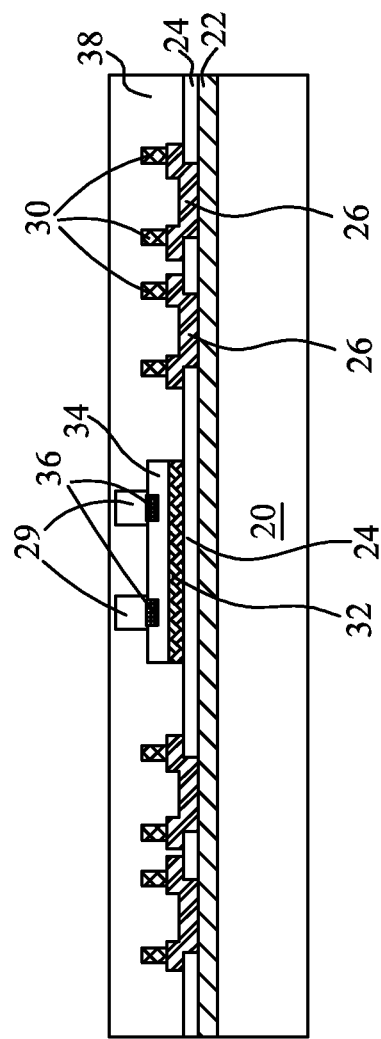

FIG. 7 illustrates the formation/mounting of electrical connectors 46. In some embodiments, electrical connectors 46 are solder balls, and are placed on bond pads 40 and then reflowed. In alternative embodiments, electrical connectors 46 may have other structures including copper pillars, solder caps, palladium layers, gold layers, and/or the like. In some embodiments, no electrical connectors are formed overlapping die 34, and the dashed solder balls 46 are not formed. In alternative embodiments, as shown by dashed electrical connectors 46, electrical connectors 46 may be formed vertically overlapping die 34.

FIG. 8 illustrates the demounting of carrier 20, which may be achieved by removing release layer 22. In the exemplary embodiment wherein release layer 22 is formed of a UV glue, a UV light may be projected onto release layer 22, so that release layer 22 and carrier 20 may be removed from ILD 24 and RDLs 26.

In FIG. 9, the wafer as shown in FIG. 8 is singulated into a plurality of packages 50, for example, along scribe lines 48. In the resulting package 50 as in FIG. 9, RDL portions 26A have top surfaces 26C level with, and forming a planar surface with, top surface 24A of ILD 24. Furthermore, RDL portions 26B are at the same level as portions of die-attach film 32, wherein die-attach film 32 and die 34 are disposed under top surface 38A of polymer-comprising material 38. Alternatively stating, die-attach film 32, die 34, and Z-interconnects 30 are embedded in polymer-comprising material 38. Package 50 may be a fan-out package, wherein RDLs 40 extends to a greater area than die 34, so that the form factor of package 50 is small.

FIGS. 10 through 26 illustrate cross-sectional views of intermediate stages in the formation of a package in accordance with alternative embodiments. Unless specified otherwise, the materials and formation methods of the components in these embodiments are essentially the same as the like components, which are denoted by like reference numerals in the embodiment shown in FIGS. 1 through 9. The formation details of the embodiment shown in FIGS. 10 through 26 (and the subsequent embodiments in FIGS. 27 through 38) may thus be found in the discussion of the embodiments shown in FIGS. 1 through 9. In the embodiments shown in FIGS. 10 through 26, any two features with reference numerals offset by 100 compared to the reference numerals in FIGS. 1 through 9 may indicate that they are essentially the same type of features, formed of similar materials, and/or using the same methods, except these two features are in different levels of the resulting package.

Figure 14A:
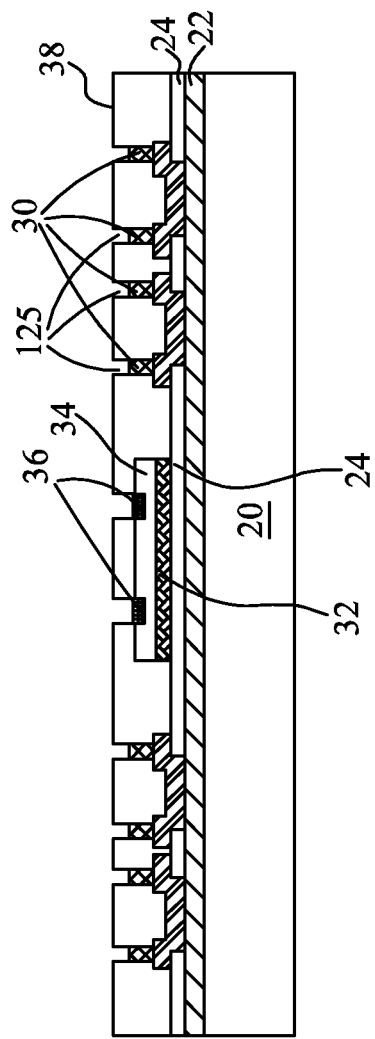
Figure 14B:
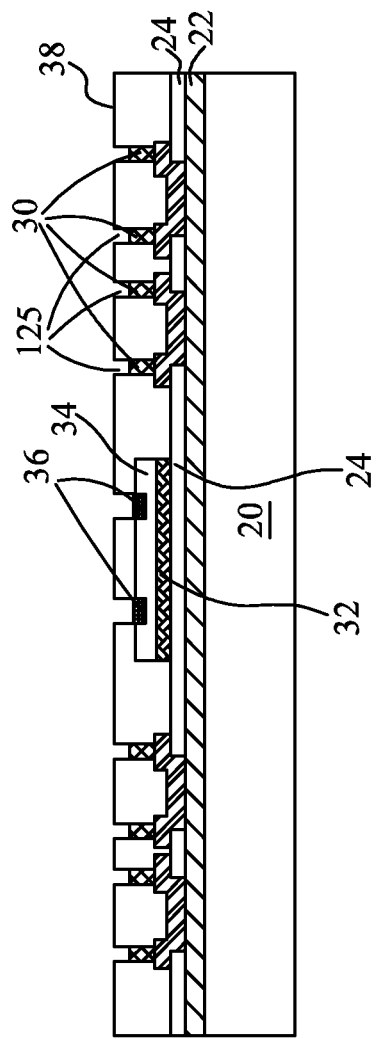
Figure 15:
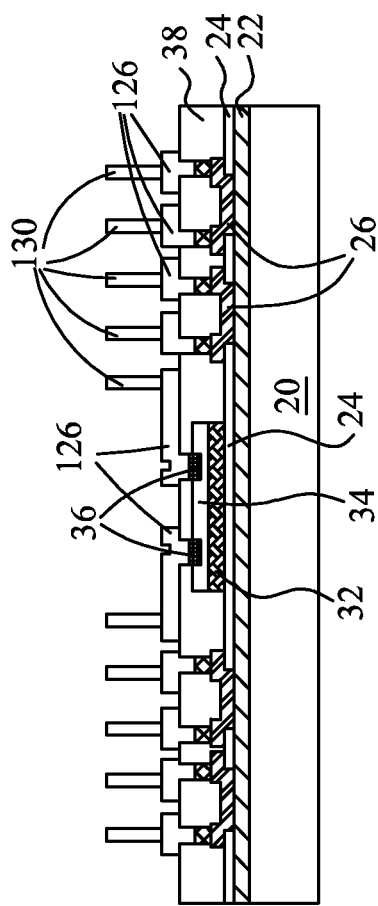

The initial steps of these embodiments are shown in FIGS. 10 through 14B, and are essentially the same as shown in FIGS. 1 through 5B. Accordingly, the details are not repeated herein. In FIGS. 13A and 14A, polymer-comprising material 38 comprises a photo-sensitive material, while in FIGS. 13B and 14B, polymer-comprising material 38 may be formed of a non-photo-sensitive material. The respective available materials and formation methods are disclosed in the embodiments shown in FIGS. 4A through 5B. In FIGS. 14A and 14B, openings 125 may be formed in the photo-sensitive polymer-comprising material 38, so that Z-interconnects 30 are exposed. Next, as shown in FIG. 15, RDLs 126 are formed to electrically connect to Z-interconnects 30 and electrical connectors 36 of die 34, followed by the formation of Z-interconnects 130, wherein Z-interconnects 130 and RDLs 126 may be formed using essentially the same methods as forming Z-interconnects 30 and RDLs 26, respectively.

Figure 16:
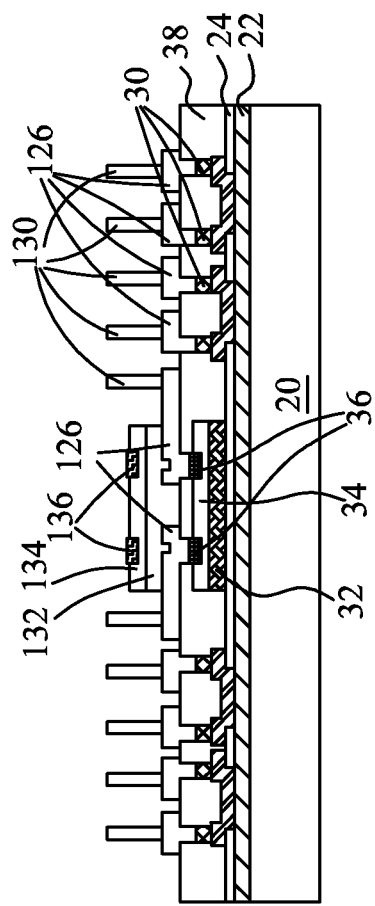
Figure 18A:
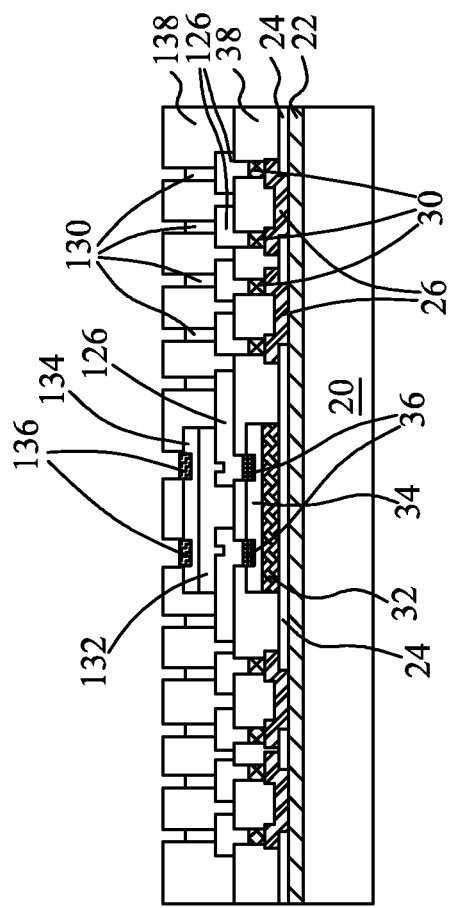
Figure 18B:
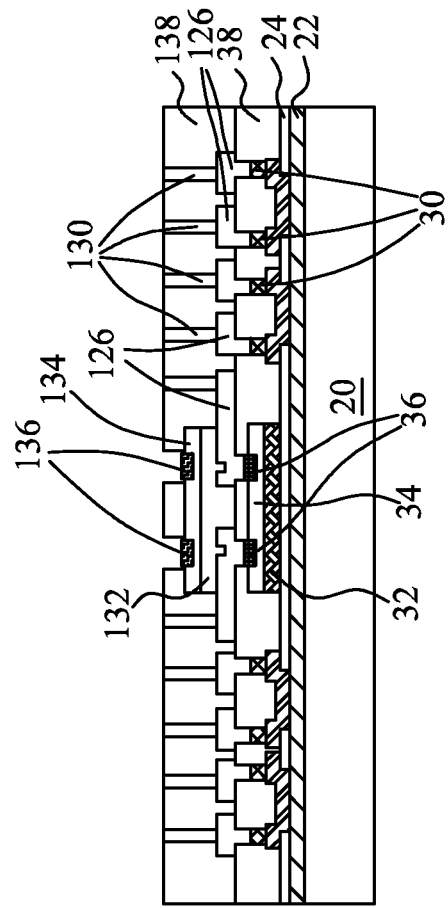
Figure 19:
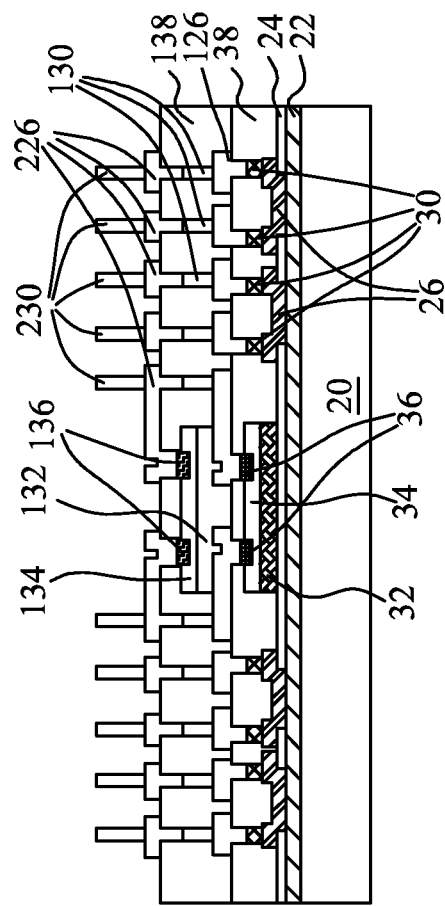
Figure 20:
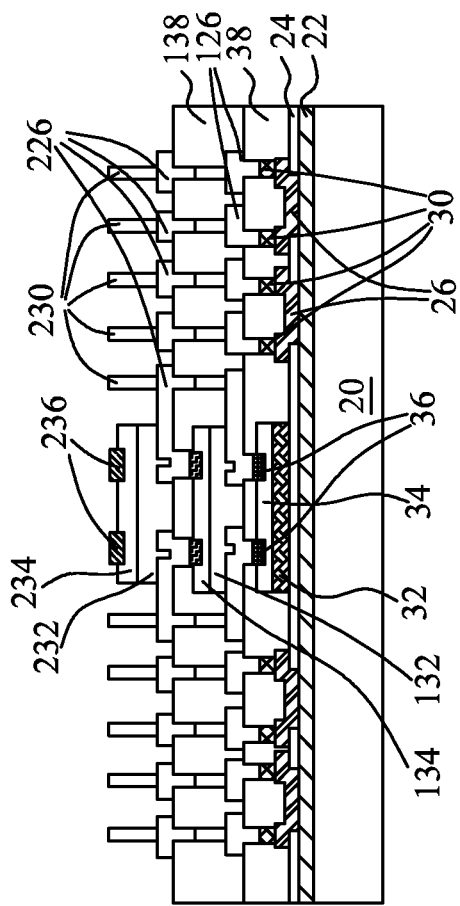

Next, as shown in FIG. 16, die 134 is attached to RDLs 126 through die-attach film 132. Die 134 may be a device die or another type of package component, and electrical connectors 136 of die 134 are exposed. In FIG. 17A, photo-sensitive polymer-comprising material 138 is formed over die 134 and Z-interconnects 130, and is then patterned using a lithograph process. The resulting structure is shown in FIG. 18A, wherein electrical connectors 136 and Z-interconnects 130 are exposed through the openings in polymer-comprising material 138. FIGS. 17B and 18B illustrate a process similar to what is shown in FIGS. 17A and 18A, except that polymer-comprising material 138 is a non-photo-sensitive material. Accordingly, as in FIG. 17B, photo resist patterns 129 may be formed to cover electrical connectors 136, and are then removed to expose the underlying electrical connectors 136.

Figure 22A:
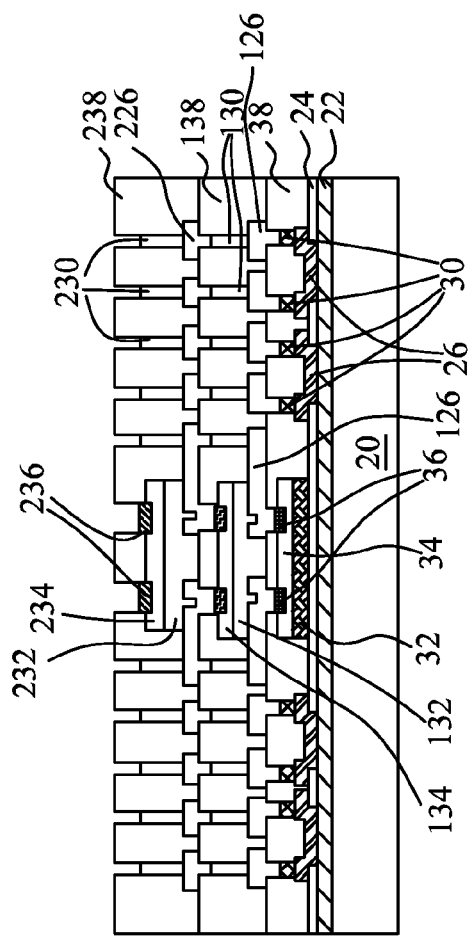
Figure 22B:
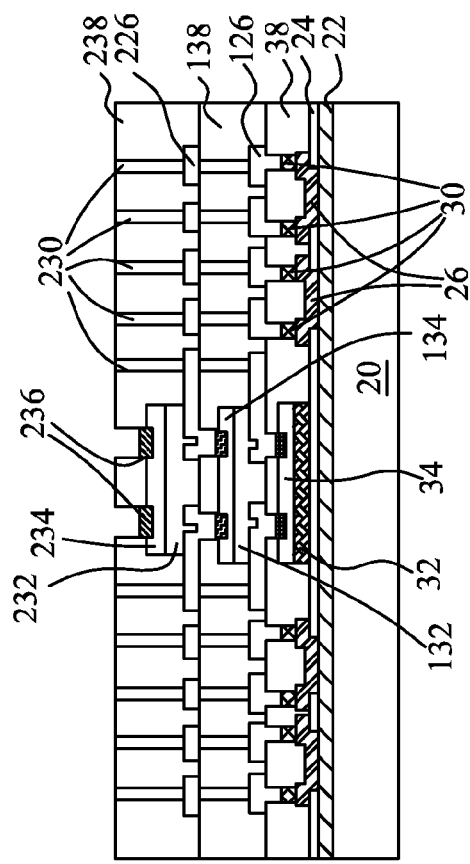

FIGS. 19 through 22B illustrate the stacking of and additional level, which process includes the formation of RDLs 226 and Z-interconnects 230 (FIG. 19), the attachment of die 234 to RDLs 226 through die-attach film 232 (FIG. 20), and the application and the patterning of photo-sensitive polymer-comprising material 238 (FIGS. 21A and 22A), or the application and the patterning of non-photo-sensitive polymer-comprising material 238 (FIGS. 21B and 22B). The process details and the respective materials may be referred to in the description of FIGS. 2 through 5B, and are not repeated herein.

Figure 23:
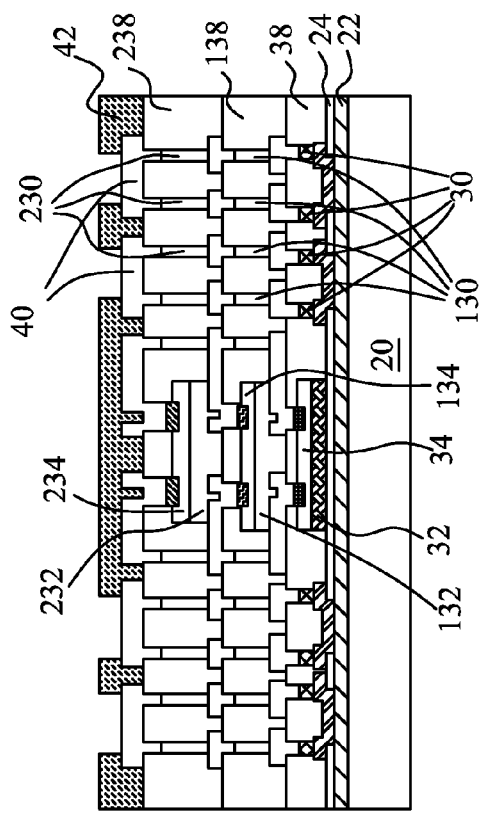
Figure 24:
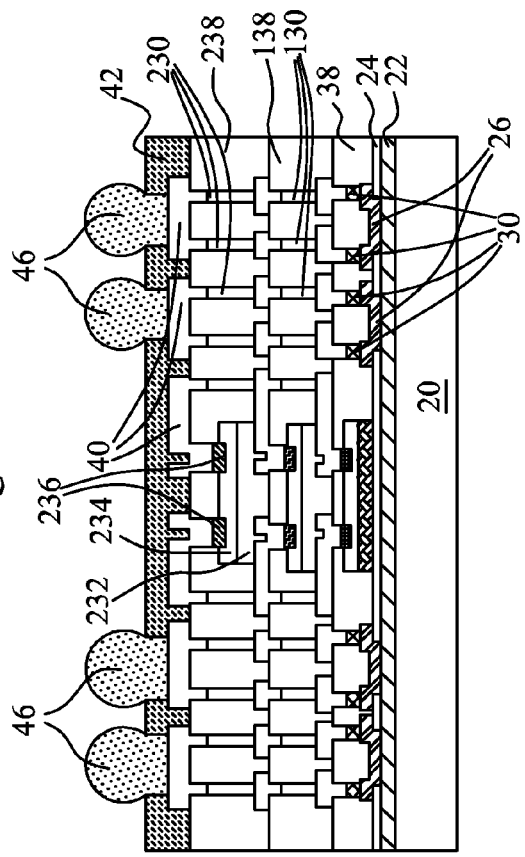

In FIG. 23, RDLs 40 and ILD 42 are formed. Electrical connectors 46 are then formed, and the resulting structure is shown in FIG. 24. Next, as shown in FIG. 25, release layer 22 and carrier 20 are removed from over ILD 24 and RDLs 26. The resulting wafer as shown in FIG. 25 is then singulated along scribe lines 48 to form a plurality of packages.

In the resulting package 150 as in FIG. 26, RDL portions 26A have top surfaces level with top surface 24A of ILD 24. Furthermore, RDL portions 26B are at the same level as portions of die-attach film 32. Dies 34, 134, 234 are stacked and are in a plurality of levels of package 150. The plurality of levels of RDLs 26, 126, and 226 is interconnected to each other through Z-interconnects 30, 130, and 230, and forms fan-out connections for dies 34, 134, 234. Dies 34, 134, and 234 and the respective die-attach films 32, 132, and 232 are embedded in the respective polymer-comprising materials 38, 138, and 238, in which the corresponding Z-interconnects 30, 130, 230 are located.

Figure 27:
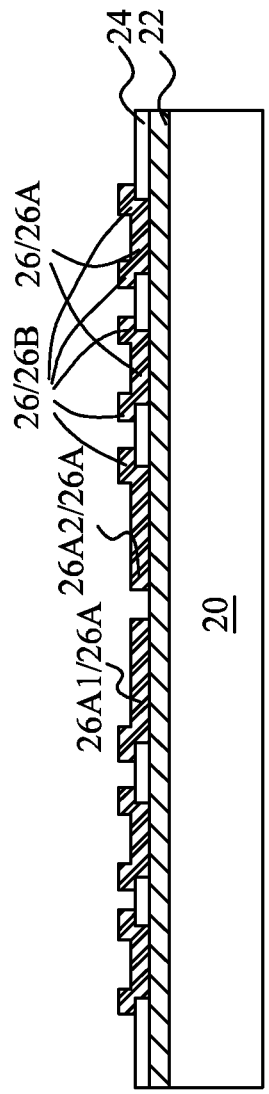
Figure 28:
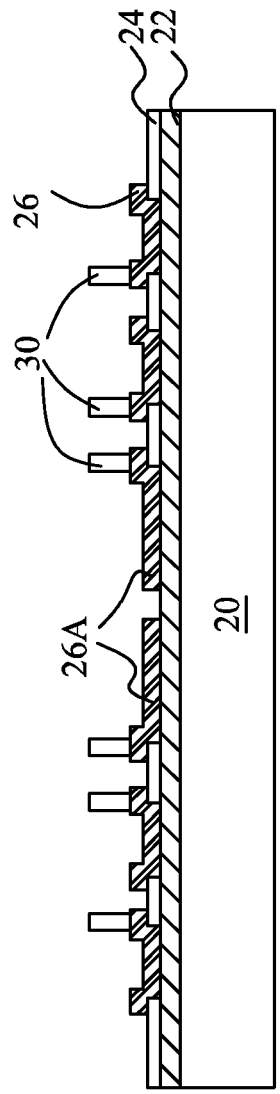
Figure 29:
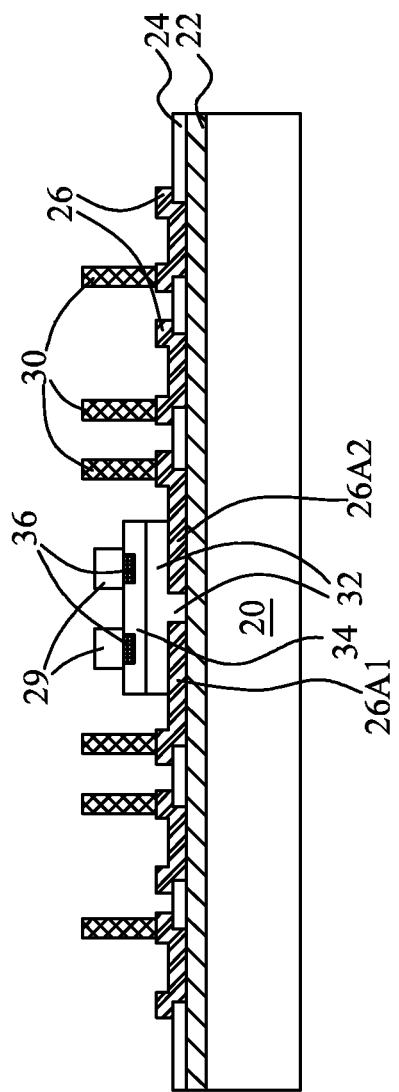

In the embodiments shown in FIGS. 1 through 26, dies are embedded inside the respective packages. FIGS. 27 through 38 illustrate alternative embodiments, wherein in addition to the embedded dies, dies may further be attached on the surfaces of packages. Referring to FIG. 27, ILD 24 and RDLs 26 are formed on release layer 22, which is further located on carrier 20. RDLs 26 includes traces 26A1 and 26A2, which are the traces for forming bump-on-trace joints with die 70 (not shown in FIG. 27, please refer to FIG. 38). Next, as shown in FIG. 28, Z-interconnects 30 are formed on RDLs 26. In FIG. 29, die 34 is attached to RDLs 26A1 and 26A2 through die-attach film 32, and optional photo resist patterns 29 may be formed to cover electrical connectors 36 of die 34. In these embodiments, die-attach film 32 may have a bottom surface in contact with the top surface of release layer 22.

FIGS. 30A and 31A illustrate the forming/dispensing and the patterning of photo-sensitive polymer-comprising material 38. Alternatively, as shown in FIGS. 30B and 31B, non-photo-sensitive polymer-comprising material 38 are applied/molded and patterned. Next, as shown in FIG. 32, ILD 42 and RDLs 40 are formed, and are electrically coupled to Z-interconnects 30 and electrical connectors 36. RDLs 40 may include traces 40A1 and 40A2. Release layer 22 and carrier 20 may then be demounted from ILD 24 and RDLs 26, as shown in FIG. 33. A singulation may then be performed along scribe lines 48 to separate the respective wafer into individual packages.

In FIG. 34, die 60 is bonded to RDLs 26 of a resulting package, for example, through a bump-on-trace structure. The respective electrical connectors 62 of die 60 may include metal pillars (which may be formed of copper or a copper alloy), and solder regions 64 that are in contact with the top surfaces and the sidewalls of RDL portions/traces 26A1 and 26A2. RDL portions 26A1 and 26A2 may be thin traces instead of large bond pads, although large bond pads may also be used. Next, as shown in FIG. 35, underfill 66 is dispensed into the gap between die 60 and RDLs 26A1/26A2 and die-attach film 32. Underfill 66 is then cured.

Figure 36:
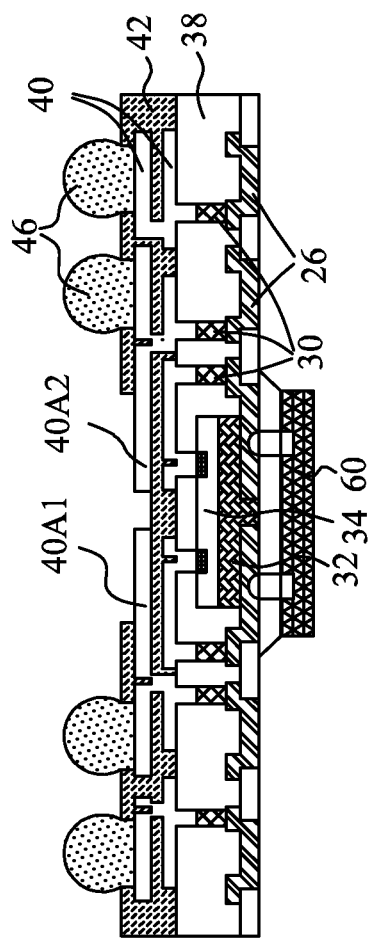
Figure 37:
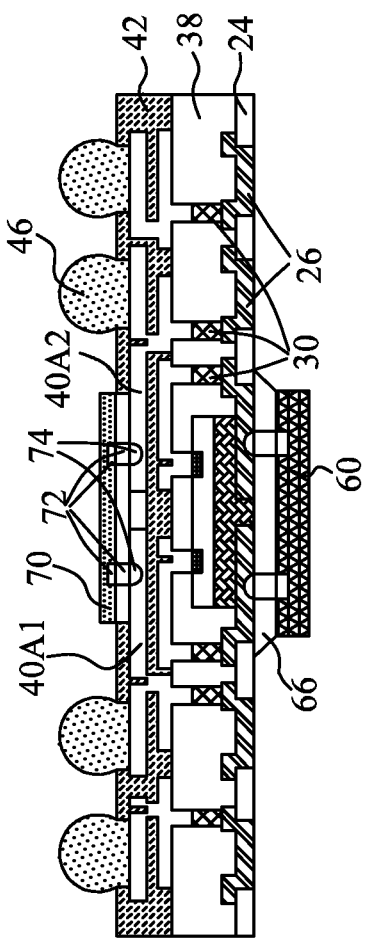
Figure 38:
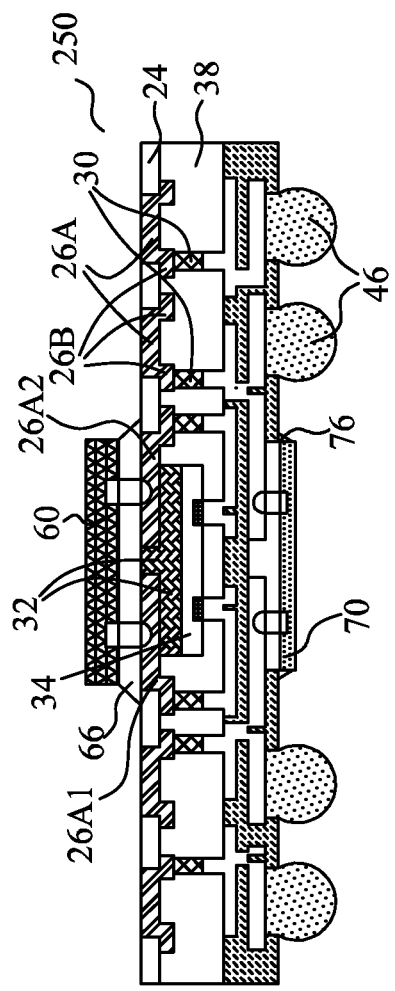

Referring to FIG. 36, electrical connectors 46, which may be solder balls, for example, are mounted/formed on RDLs 40. In FIG. 37, an additional die 70 is further bonded to RDLs 40, for example, through the bump-on-trace structure. The respective electrical connectors 72 of die 70 may include metal pillars (which may be formed of copper or a copper alloy) and solder regions 74 that are in contact with the top surfaces and the sidewalls of RDLs 40A1 and 40A2. RDLs 40A1 and 40A2 may be thin traces instead of large bond pads. Next, as shown in FIG. 38, underfill 76 is dispensed into the gap between die 70 and RDLs 40 and cured. Please note that FIG. 38 shows a structure flipped from what is shown in FIG. 37.

In the resulting package 250 as in FIG. 38, RDL portions 26A have top surfaces level with top surface 24A of ILD 24. Furthermore, RDL portions 26B may be at the same level as portions of die-attach film 32. Dies 60 and 70 are bonded on the opposite surfaces of package 250. The plurality of levels of RDLs is interconnected to each other through Z-interconnects. Furthermore, die 34 and die-attach film 32 are embedded in polymer-comprising materials 38, in which Z-interconnects 30 are located. Package 250 is also a fan-out package.

Figure 39:
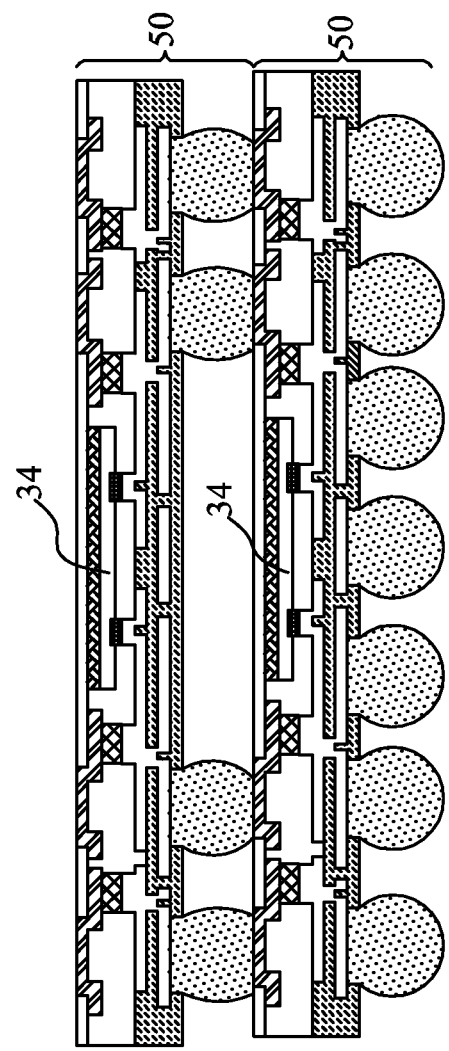
FIGS. 39 through 41 are package-on-package structures comprising the packages formed in the embodiments shown in FIGS. 1 through 38.
Figure 40:
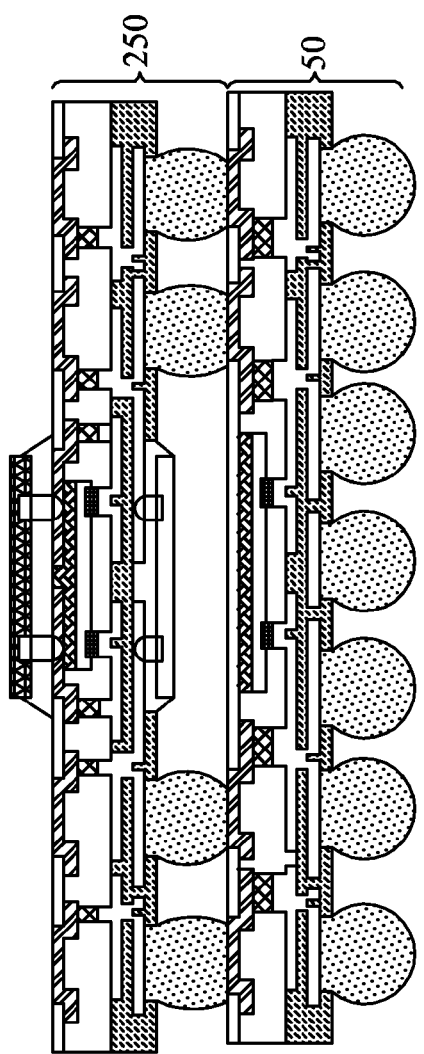
Figure 41:
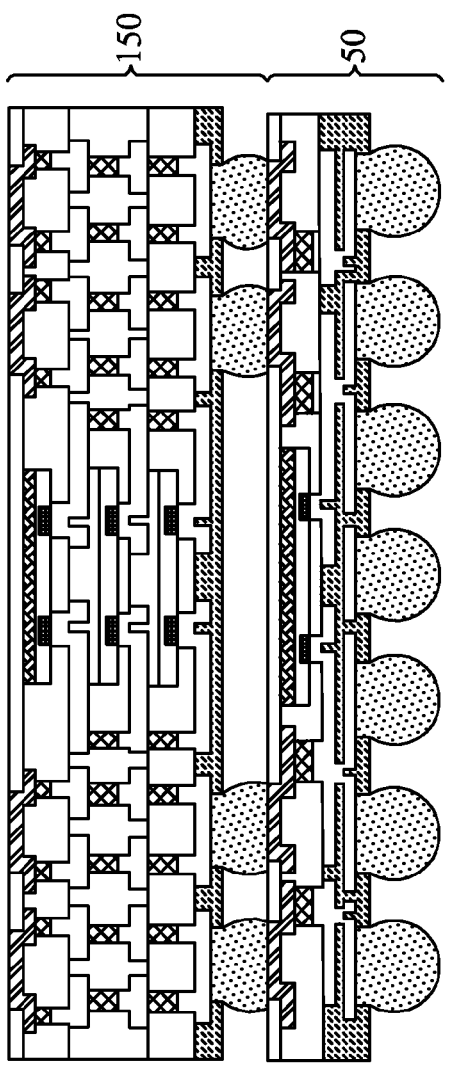

The packages as shown in FIGS. 9, 26, and 38 may be stacked on each other in any combination to form package-on-package structures. For example, FIG. 39 illustrates an embodiment in which two of the packages 50 are stacked. In this structure, dies 34 in two packages 50 may have an identical structure or have different structures. FIG. 40 illustrates an embodiment in which package 250 as in FIG. 38 is stacked on package 50 as in FIG. 9. FIG. 41 illustrates an embodiment in which packages 150 as in FIG. 26 is stacked on package 50 as in FIG. 9. It is noted that there are more combinations, which are also in the scope of the embodiments.

In accordance with embodiments, a device includes an inter-layer dielectric, a device die under the inter-layer dielectric; and a die-attach film under the inter-layer dielectric and over the device die, wherein the die-attach film is attached to the device die. A plurality of redistribution lines includes portions level with the die-attach film. A plurality of Z-interconnects is electronically coupled to the device die and the plurality of redistribution lines. A polymer-comprising material is under the inter-layer dielectric. The device die, the die-attach film, and the plurality of Z-interconnects are disposed in the polymer-comprising material.

In accordance with other embodiments, a device includes an inter-layer dielectric, a device die under the inter-layer dielectric, and a die-attach film attaching the device die to the inter-layer dielectric, wherein a top surface of the die-attach film contacts a bottom surface of the inter-layer dielectric. A first plurality of redistribution lines includes first portions level with the die-attach film, and second portions in the inter-layer dielectric. A plurality of Z-interconnects is disposed under the first plurality of redistribution lines, and electronically coupled to the device die and the first plurality of redistribution lines. A polymer-comprising material is under the inter-layer dielectric, wherein the device die, the die-attach film, and the plurality of Z-interconnects are disposed in the polymer-comprising material. A second plurality of redistribution lines is under the plurality of Z-interconnects, wherein the first and the second plurality of redistribution lines are on opposite sides of, and are electrically coupled through, the plurality of Z-interconnects.

In accordance with yet other embodiments, a device an inter-layer dielectric, a first device die under the inter-layer dielectric, a die-attach film over and attached to the device die, and a first plurality of redistribution lines comprising first portions level with a portion of the die-attach film, and second portions in the inter-layer dielectric and contacting the die-attach film. A plurality of Z-interconnects is disposed under the first plurality of redistribution lines and electronically coupled to the first device die and the first plurality of redistribution lines. A polymer-comprising material is disposed under the inter-layer dielectric, wherein the first device die, the die-attach film, and the plurality of Z-interconnects are disposed in the polymer-comprising material. A second plurality of redistribution lines is under the plurality of Z-interconnects, wherein the first and the second plurality of redistribution lines are on opposite sides of, and are electrically coupled through, the plurality of Z-interconnects. A second device die is over and bonded to the second portions of the first plurality of redistribution lines. A third device die is under and bonded to the second plurality of redistribution lines, wherein the second and the third device dies are at opposite surfaces of the device.

In accordance with yet other embodiments, a method includes forming an inter-layer dielectric over and in contact with a release layer, wherein the release layer is further disposed over a carrier, forming a first plurality of redistribution lines, wherein the first plurality of redistribution lines comprises first portions extending into the inter-layer dielectric and in contact with the release layer, and second portions over the inter-layer dielectric, attaching a device die to a top surface of the inter-layer dielectric or top surfaces of the first portions of the first plurality of redistribution lines through a die-attach film, and forming Z-interconnects over and electrically coupled to the first plurality of redistribution lines. After the step of forming the Z-interconnects, forming a polymer-comprising material, wherein the second portions of the first plurality of redistribution lines, the die-attach film, and the device die are in the polymer-comprising material. A second plurality of redistribution lines is formed over the polymer-comprising material, wherein the second plurality of redistribution lines is electrically coupled to the device die, and electrically coupled to the first plurality of redistribution lines through the Z-interconnects.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first plurality of redistribution lines;
    forming first Z-interconnects over and electrically coupled to the first plurality of redistribution lines;
    attaching a first device die, wherein a portion of the first device die is substantially coplanar with a portion of the first Z-interconnects;
    after the forming the first Z-interconnects, encapsulating the first device die and the first Z-interconnects in a first encapsulation material; and
    forming a second plurality of redistribution lines electrically coupling to the first device die, wherein the first plurality of redistribution lines and the second plurality of redistribution lines are on opposite sides of the first Z-interconnects.

2. The method of claim 1, wherein the first encapsulation material comprises a photo-sensitive material, and the method further comprises, after the encapsulating the first encapsulation material, performing a lithography process on the first encapsulation material to expose the first Z-interconnects and electrical connectors of the first device die.

3. The method of claim 1, wherein the first encapsulation material comprises a molding compound covering photo resist patterns of the first device die, with the photo resist patterns covering electrical connectors of the first device die, and wherein the method further comprises:
    grinding the first encapsulation material to expose the photo resist patterns and the first Z-interconnects; and
    removing the photo resist patterns to reveal the electrical connectors.

4. The method of claim 1 further comprising:
    stacking a second device die over the second plurality of redistribution lines;
    forming second Z-interconnects over and electrically coupled to the second plurality of redistribution lines; and
    molding the second device die and the second Z-interconnects in a second encapsulation material.

5. The method of claim 1, wherein the first plurality of redistribution lines is formed over a release layer, and the method further comprises:
    detaching the release layer from the first plurality of redistribution lines; and
    bonding a second device die onto the first plurality of redistribution lines.

6. The method of claim 5, wherein the second device die is bonded onto the first plurality of redistribution lines through bump-on-tracing bonding.

7. The method of claim 1, wherein the first plurality of redistribution lines comprises first portions extending into an inter-layer dielectric, and second portions over the inter-layer dielectric.

8. A method comprising:
    forming a first plurality of redistribution lines;
    forming Z-interconnects over and electrically coupled to the first plurality of redistribution lines;
    placing a first device die, wherein a portion of the first device die is substantially coplanar with a portion of the Z-interconnects;

encapsulating the Z-interconnects and the first device die in a photo-sensitive material, with the photo-sensitive material comprising portions covering electrical connectors of the first device die and the Z-interconnects;

removing the portions of the photo-sensitive material, wherein the electrical connectors of the first device die and the Z-interconnects are exposed through openings in the photo-sensitive material; and forming a second plurality of redistribution lines over the photo-sensitive material and electrically coupling to the electrical connectors of the first device die and the Z-interconnects.

9. The method of claim 8 further comprising:

forming a patterned dielectric layer over a carrier, wherein the first plurality of redistribution lines comprises first portions extending into the patterned dielectric layer, and second portions over the patterned dielectric layer, and wherein the first device die overlaps the patterned dielectric layer.

10. The method of claim 8, wherein the first device die overlaps the first plurality of redistribution lines.

11. The method of claim 10 further comprising bonding a second device die to physically contact the first plurality of redistribution lines.

12. The method of claim 8, wherein the second plurality of redistribution lines extends into the openings to contact the electrical connectors of the first device die and the Z-interconnects.

13. The method of claim 8 further comprising attaching a second device die over the second plurality of redistribution lines.

14. The method of claim 8, wherein the first plurality of redistribution lines is in contact with a release layer over a carrier, and the method further comprises removing the release layer to expose the first plurality of redistribution lines.

15. A method comprising:

forming a patterned dielectric layer over a carrier;

forming a first plurality of redistribution lines comprising first portions extending into the patterned dielectric layer, and second portions over the patterned dielectric layer;

forming Z-interconnects over and electrically coupled to the first plurality of redistribution lines;

placing a first device die over the patterned dielectric layer, wherein the first device die comprises a plurality of photo-sensitive regions covering electrical connectors of the first device die;

encapsulating the Z-interconnects and the first device die in an encapsulation material, with the encapsulation material comprising portions covering the plurality of photo-sensitive regions and the Z-interconnects; and removing the plurality of photo-sensitive regions to reveal the electrical connectors.

16. The method of claim 15 further comprising:

before the removing the plurality of photo-sensitive regions, planarizing the encapsulation material to expose the plurality of photo-sensitive regions.

17. The method of claim 15 further comprising forming a second plurality of redistribution lines over the encapsulation material and electrically coupling to the electrical connectors of the first device die and the Z-interconnects.

18. The method of claim 17, wherein the second plurality of redistribution lines extends into openings formed by the removed plurality of photo-sensitive regions to contact the electrical connectors of the first device die.

19. The method of claim 15 further comprising bonding a second device die directly to the first plurality of redistribution lines.

20. The method of claim 15, wherein the plurality of photo-sensitive regions is a discrete region, and wherein the encapsulation material is filled into spaces between the plurality of photo-sensitive regions.

* * * * *